US009063192B2

(12) United States Patent
Huang et al.

(10) Patent No.: US 9,063,192 B2
(45) Date of Patent: Jun. 23, 2015

(54) SPLIT GATE STRUCTURE AND METHOD OF USING SAME

(75) Inventors: Yen-Chieh Huang, Zhubei (TW); Ching-Huang Wang, Pingjhen (TW); Tsung-Yi Yu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 963 days.

(21) Appl. No.: 13/048,939

(22) Filed: Mar. 16, 2011

(65) Prior Publication Data
US 2012/0235702 A1 Sep. 20, 2012

(51) Int. Cl.
*G01R 31/26* (2014.01)
*G11C 29/48* (2006.01)

(52) U.S. Cl.
CPC ............... *G01R 31/26* (2013.01); *G11C 29/48* (2013.01)

(58) Field of Classification Search
USPC ............... 324/760.01–762.09, 500; 257/331, 257/E29.262, E21.41, 330
See application file for complete search history.

(56) References Cited

U.S. PATENT DOCUMENTS

| 6,396,740 B1 * | 5/2002 | Chih et al. ................. 365/185.2 |
| 6,667,902 B2 | 12/2003 | Peng |
| 7,268,575 B1 | 9/2007 | Chen et al. |
| 7,479,797 B2 | 1/2009 | Kim |
| 7,820,457 B2 | 10/2010 | Chen et al. |
| 8,373,225 B2 * | 2/2013 | Hsieh ............................ 257/331 |
| 8,482,052 B2 * | 7/2013 | Lue et al. ....................... 257/324 |
| 2005/0212527 A1 | 9/2005 | Wu |
| 2008/0122476 A1 | 5/2008 | Wang et al. |
| 2010/0097091 A1 | 4/2010 | Shih et al. |
| 2011/0312138 A1 * | 12/2011 | Yedinak et al. ............... 438/270 |

OTHER PUBLICATIONS

Alam, M.A. et al., "A Comprehensive Model for PMOS NBTI Degradation: Recent Progress", Science Direct-Microelectronics Reliability, 2007, 47:853-862.
"Semiconductor Device Qualification with Multiple Failure Mechanisms", Archives of the Reliability Information Analysis Center—RIAC Desk Reference, 2006, 10 pages.

* cited by examiner

*Primary Examiner* — Melissa Koval
*Assistant Examiner* — Trung Nguyen
(74) *Attorney, Agent, or Firm* — Duane Morris LLP; Steven E. Koffs

(57) ABSTRACT

A method comprises providing first and second semiconductor devices. Each device comprises a transistor having a split gate electrode including first and second gate portions. Each device has a respective ratio between an area of its first gate portion and a sum of areas of its first and second gate portions. For each device, a stress voltage is applied to the first gate portion, but not to the second gate portion. For each device, the first and second gate portions are biased with a common voltage, and data are collected indicating a respective degradation for each device due to the stress voltage. The degradation has a component due to time dependent dielectric breakdown (TDDB) and a component due to bias temperature instability. From the collected data extrapolation determines the degradation component due to TDDB.

19 Claims, 8 Drawing Sheets

SPLIT GATE STRUCTURE AND METHOD OF USING SAME

FIELD

This disclosure relates to semiconductor fabrication generally, and more specifically to semiconductor device reliability.

BACKGROUND

Negative and Positive bias temperature instability (NBTI and PBTI) and time dependent dielectric breakdown (TDDB) are important reliability issues in MOSFETs. NBTI and PBTI are collectively referred to below as bias temperature instability (BTI).

NBTI affects p-channel MOS devices, which usually operate with negative gate-to-source voltage, as well as nMOS transistors when biased in the accumulation regime with a negative bias applied to the gate. NBTI increases the threshold voltage $V_T$ and decreases drain current and transconductance. The NBTI degradation can be characterized by the fractional reduction in drive current for a given drive voltage or by the increase in leakage current.

A substantial portion of the degradation due to NBTI is recovered over time during use. PBTI affects nMOS transistor when positively biased. Generally all of the $V_T$ degradation due to PBTI may be recovered over time during usage.

TDDB is a failure mechanism that occurs when the gate oxide breaks down as a result of long-time application of relatively low electric field (as opposite to immediate breakdown, which is caused by strong electric field). The breakdown is caused by formation of a conducting path through the gate oxide to substrate due to electron tunneling current, when MOSFETs are operated close to or beyond their specified operating voltages.

At high voltage, both BTI & TDDB contribute to total degradation. Thus, during device development, the stress voltages that are used for accelerated testing and estimating device lifetimes causes both BTI and TDDB. It is difficult to distinguish how much degradation is due to interface traps (BTI) and how much is due to intrinsic oxide quality (TDDB). As a result, the degradation is overestimated. In order to meet device and product specification based on the pessimistic degradation estimates, product design is more difficult and expensive than would be the case if degradation is more accurately predicted.

DETAILED DESCRIPTION

Figure 1A:
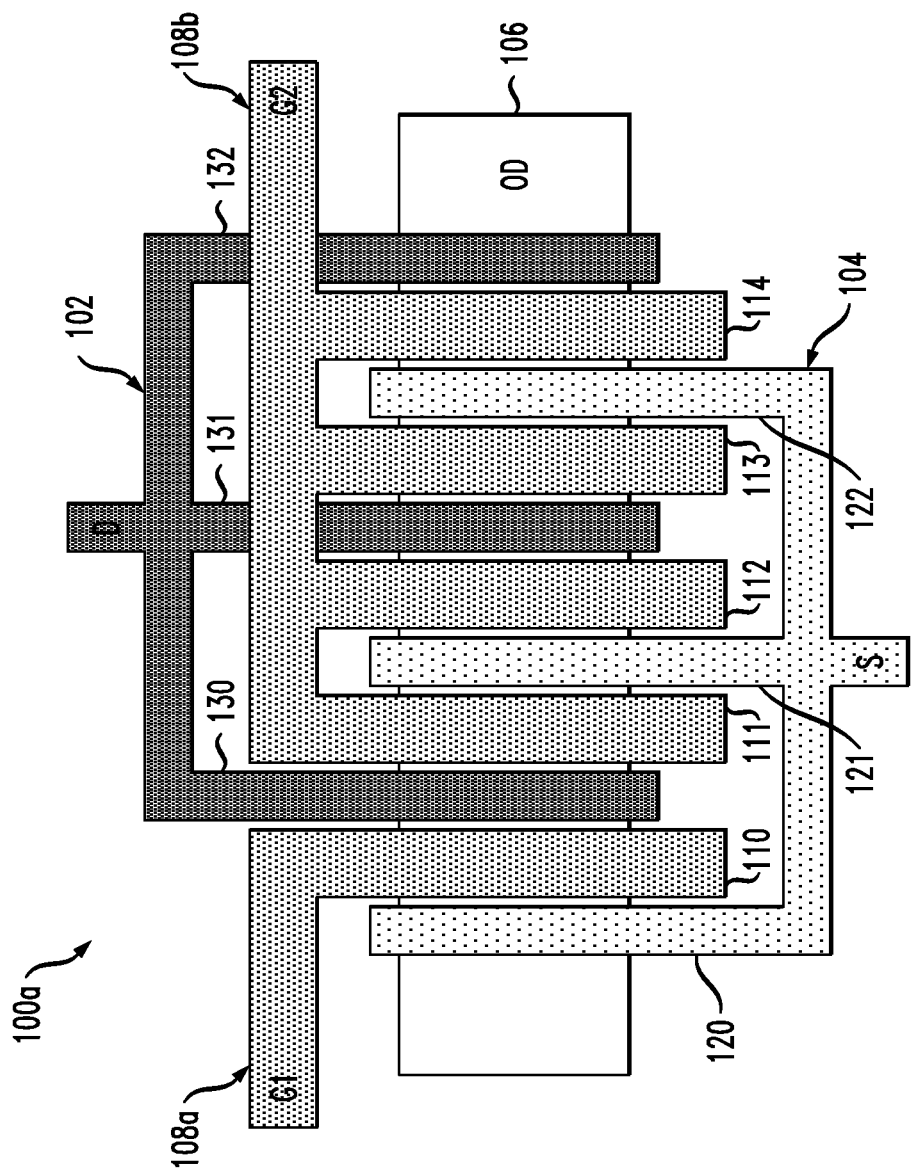
FIGS. 1A-1C show an embodiment of a test structure.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

FIGS. 1A-1C and 2 show a test structure 100a-100c and a semiconductor wafer 200 including the test structure 100a-100c. The substrate 200 can be a silicon substrate, a III-V compound substrate, a silicon/germanium (SiGe) substrate, a silicon-on-insulator (SOI) substrate, a display substrate such as a liquid crystal display (LCD), a plasma display, an electro luminescence (EL) lamp display, or a light emitting diode (LED) substrate, according to various exemplary embodiments.

Figure 1B:
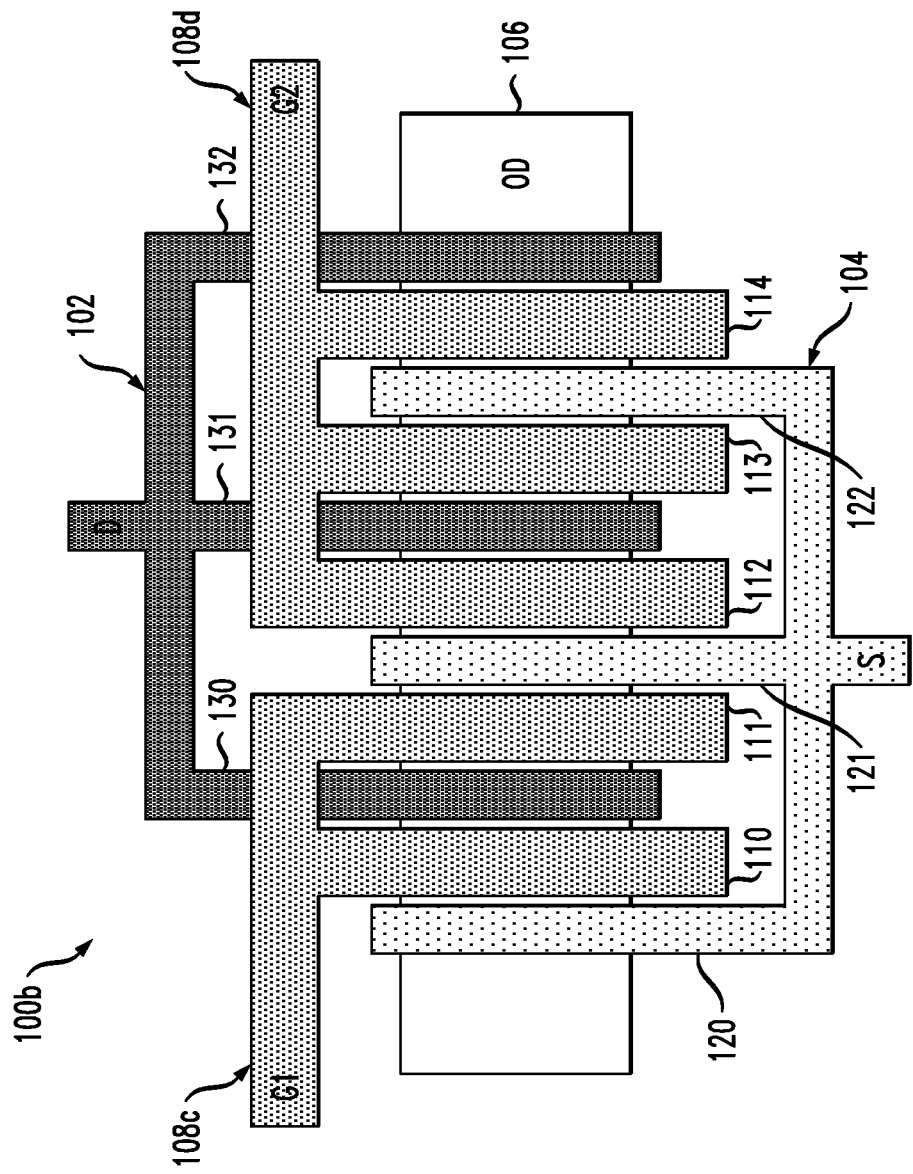

Referring to FIGS. 1A and 1B, the test structure 100a on the at least one wafer 200 includes a first semiconductor device 100a (FIG. 1A) and a second semiconductor device 100b (FIG. 1B). Each of the first semiconductor devices 100a and second semiconductor device 100b comprises a transistor having an active area (OD) 106, a drain 102 and a source 104.

In some embodiments, each transistor has a high-k gate dielectric layer. In other embodiments, the gate dielectric material of each transistor is formed of a dielectric such as a silicon oxide. The gate electrode layer may comprise polycrystalline silicon. The source 104 and drain 102 may be doped implant regions.

The transistor of the first device 100a and the transistor of the second device 100b have source structures 104 that are the same (size, configuration and composition) as each other. The transistor of the first device 100a and the transistor of the second device 100b also have drain structures 102 that are the same (size, configuration and composition) as each other.

Each of the semiconductor devices comprises a split gate electrode having first and second gate portions, and having a respective ratio between an area of the first gate portion thereof and a sum of areas of the first and second gate portions thereof. For example, in FIG. 1A, the semiconductor device 100a has a first gate portion 108a and a second gate portion 108b. The area ratio of device 100a is equal to $A_{108a}/(A_{108a}+A_{108b})$, where $A_{108a}$ is the area of gate portion 108a, and $A_{108b}$ is the area of gate portion 108b.

Similarly, in FIG. 1B, the semiconductor device 100b has a first gate portion 108c and a second gate portion 108d. The area ratio of device 100b is equal to $A_{108c}/(A_{108c}+A_{108d})$, where $A_{108c}$ is the area of gate portion 108c, and $A_{108d}$ is the area of gate portion 108d. Also, in FIG. 1C, the semiconductor device 100c has a first gate portion 108e and a second gate portion 108f. The area ratio of device 100c is equal to $A_{108e}/(A_{108e}+A_{108f})$, where $A_{108e}$ is the area of gate portion 108e, and $A_{108f}$ is the area of gate portion 108f.

The area ratio of the second device 100b is different from the area ratio of the first device 100a. The area ratio of the third device 100c is different from the area ratios of the first device 100a and the second device 100b.

Figure 2:
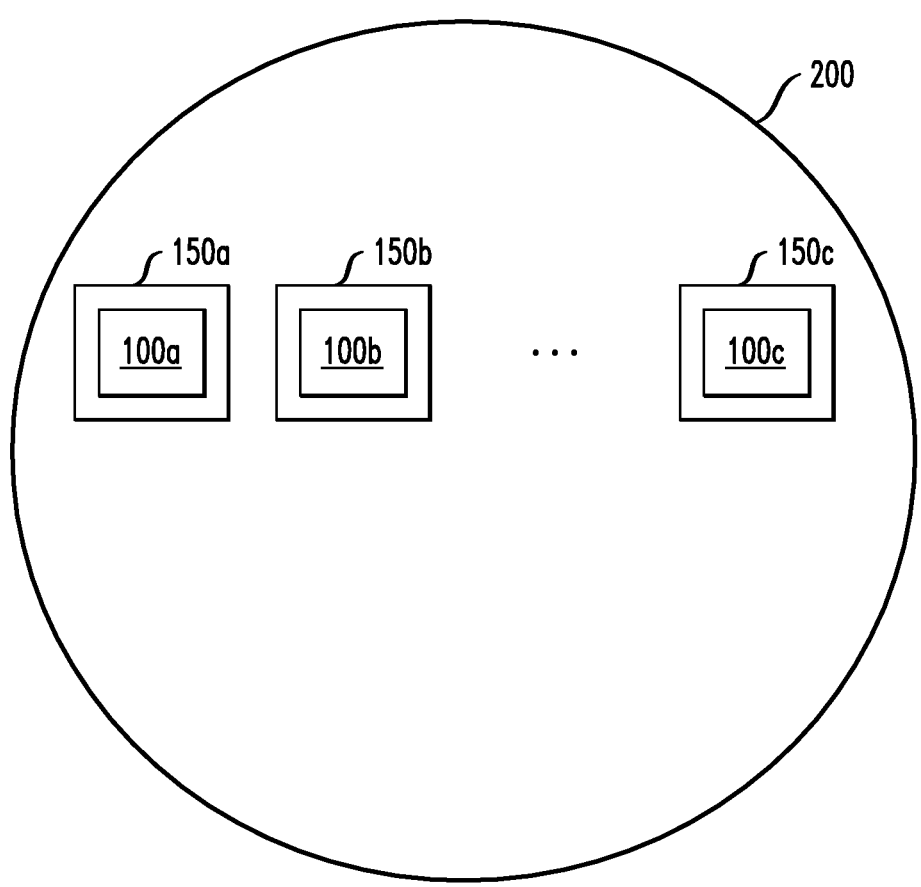
FIG. 2 shows a semiconductor wafer having at least one test chip, each test chip having at least one of the test structures of FIG. 1A, 1B or 1C.

In a given design of experiment, at least one test wafer 200 is fabricated and tested electrically, having a desired number of test structures 100a, 100b, ... 100c. In some embodiments, as shown in FIG. 2, a single wafer 200 has a plurality of integrated circuits (test dies) 150a-150c, each test die 150a-150c having at least one of the test structures 100a-100c.

In some alternative embodiments, the various test structures 100a-100c are all included in a single test die. In an alternative embodiment, each respective die has a respectively different one of the test structures 100a-100c. In other alternative embodiments (not shown), a plurality of wafers are provided, and each wafer has at least one of the plurality of test structures 100a-100c. If the test structures are distributed across plural wafers, each of the wafers should be subjected to the same processing conditions, so that differences between devices are due to the configuration of the split gate in each device, and not due to differences in process parameters.

Referring again to FIGS. 1A-1C, the source structure 104 of each of the transistors 100a-100c comprises: a plurality of source regions 120-122 connected to each other, and the drain structure 102 of each transistor 100a-100c comprises a plurality of drain regions 130-132 connected to each other. In each transistor 100a-100c, the first gate portion 108a, 108c, 108e and the second gate portions 108b, 108d, 108f each have at least one gate segment 110-114 arranged between a respective one of the plurality of source regions 120-122 and an adjacent one of the plurality of drain regions 130-132.

In some embodiments, the plurality of drain regions 130-132 are arranged in a first comb configuration 102, the plurality of source regions 120-122 are arranged in a second comb configuration 104, with the source regions and drain regions interleaved with each other. At least one of the first gate portion (108a, 108c or 108e) and/or the second gate portion (108b, 108d or 108f) includes a plurality of fingers 110-114 arranged in a comb configuration (e.g., 108b, 108c, 108d or 108e); each source region 120-122 is separated from each adjacent drain region 130-132 by a respective one of the first or second gate portions 110-114. In some embodiments, one of the first gate portion 108a (FIG. 1A) or the second gate portion 108f (FIG. 1C) has only a single "finger" region interposed between a source/drain pair.

Figure 1C:
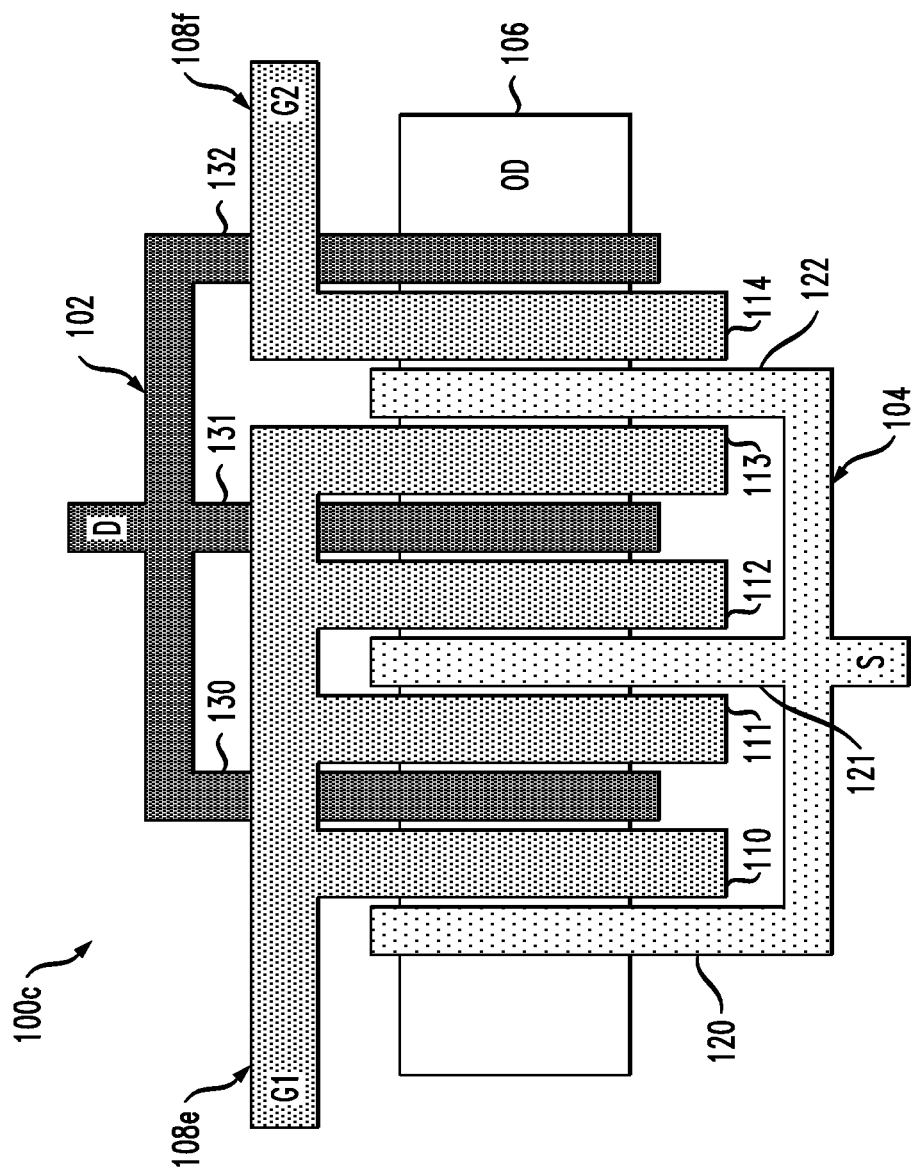

Although FIGS. 1A to 1C show an example in which the source comb structure 104 has three source regions 130-132 connected together, the drain comb structure 102 has three drain regions 120-122 connected together, and the split gate has a total of five "fingers" 110-114, other configurations may be used. For example, given any integer N greater than zero, the configuration may have N+1 source finger regions 120-122 connected to each other, N+1 drain finger regions 130-132 connected to each other, and a total of 2N+1 gate fingers 110-114 divided among two gate portions. Thus, FIGS. 1A to 1C all correspond to the case where N=2, but in other embodiments, N may be any integer greater than zero. As another example, data points for an area ratio of 0.11 and 0.89 may be collected using a configuration in which N=4, and the two split gate comb structures have a total of 9 fingers.

Figure 3:
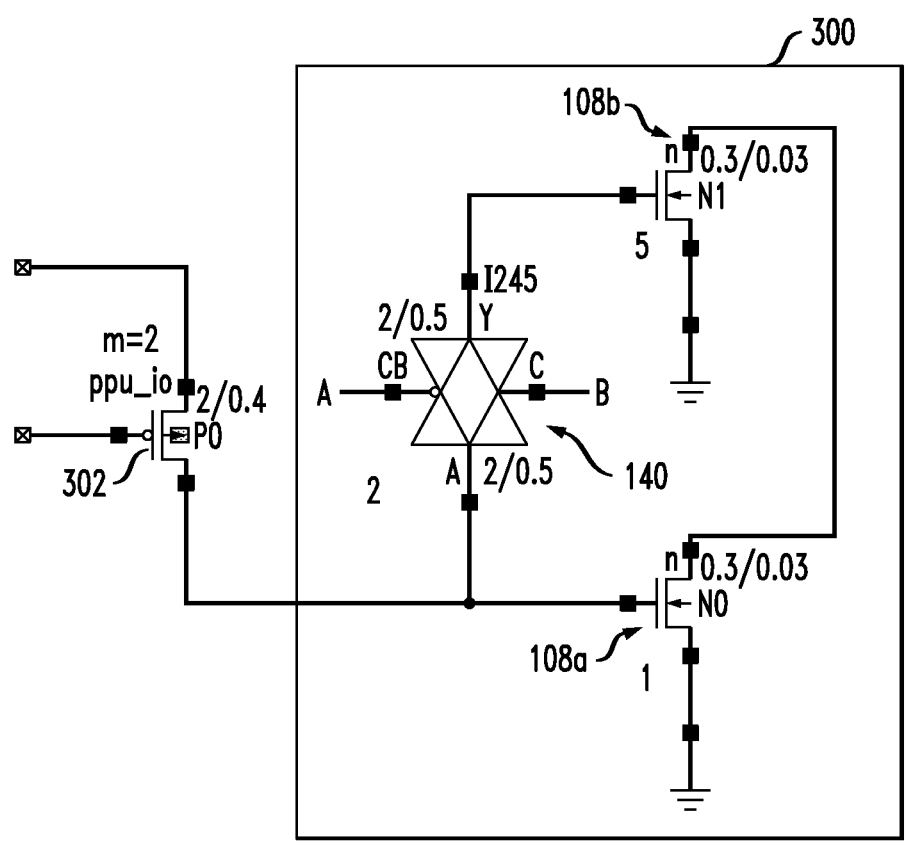
FIG. 3 is a schematic diagram of the test structure of FIG. 1A.

FIG. 3 is a schematic diagram of one embodiment of a test apparatus 300, including the semiconductor device 100a having respective ports connected to a switching device, such as a transmission gate 140. When the high stress voltage is applied, then the transmission gate 140 blocks the high voltage from the second gate portion 108b. The first gate portion 108a is directly coupled to the voltage source (e.g., PMOS switching transistor 302), bypassing the transmission gate. Thus the first gate portion is subjected to the high voltage. When the measurement is performed then transmission gate 140 passes the gate voltage Vdd to the second gate portion 108b, and both gate portions 108a, 108b are subjected to the same measurement voltage.

Figure 4:
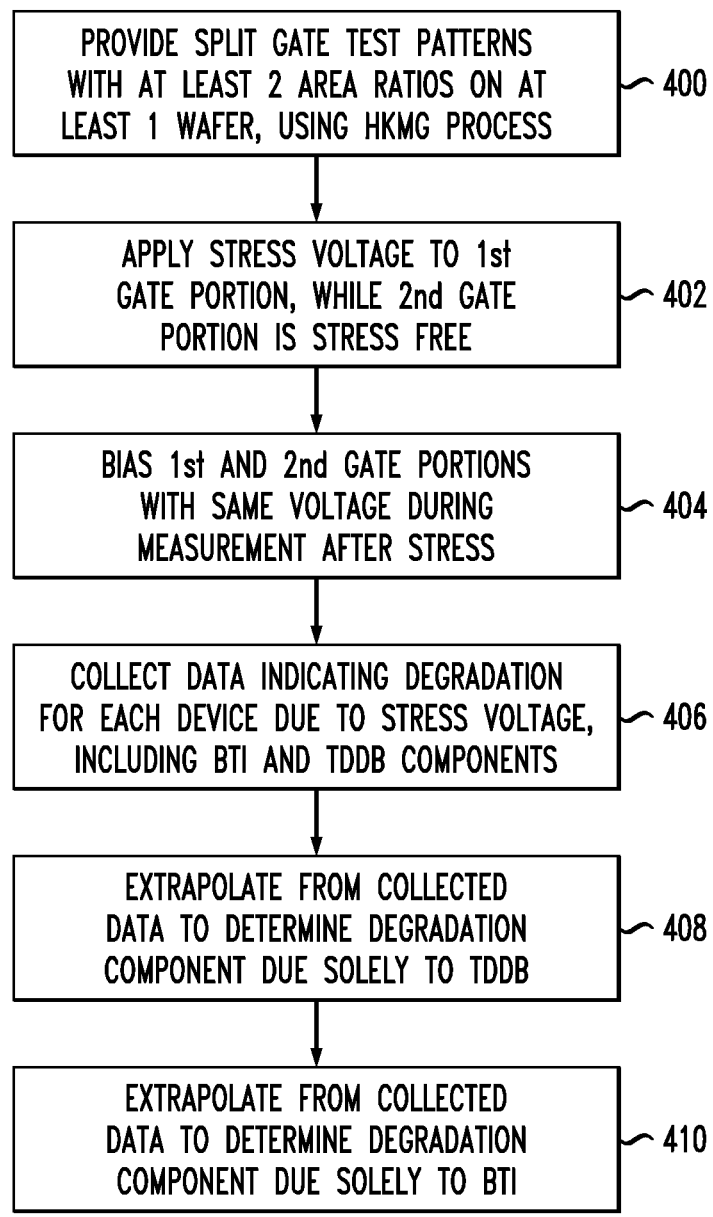
FIG. 4 is a diagram showing extrapolation based on data collected from the test structures of FIGS. 1A-1C.

FIG. 4 is a flow chart of a method of using the test structures of FIGS. 1A-1C to apportion degradation effects between BTI and TDDB.

At step 400, first and second semiconductor devices 100a, 100b are provided, each comprising a transistor having a split gate electrode having first and second gate portions 108a, 108b (or 108c, 108d), and each having a respective ratio $A_{108a}/(A_{108a}+A_{108b})$ between an area of the first gate portion thereof and a sum of areas of the first and second gate portions thereof. In some embodiments, the first and second devices 100a, 100b are provided on the same chip. In some embodiments, the first and second devices are provided on respectively different dies on the same wafer. In some embodiments, the first and second devices are provided on respectively different wafers subjected to the same process recipe. Prior to application of any stress voltage, baseline performance measurements are taken, to serve as the reference point for measuring degradation.

At step 402, for each device, a stress voltage is applied to the first gate portion 108a (or 108c or 108e), but not to the second gate portion 108b (or 108d or 108f). For example, in one embodiment, the first gate portion 108a is subjected to a high voltage HV, and the source 104, drain 102, second gate portion 108b and OD 106 are coupled to ground (zero volts). The stress voltage is sufficiently high to cause degradation in the gate dielectric layer due to at least one of BTI and/or TDDB. Thus, for each area ratio $A_{108a}/(A_{108a}+A_{108b})$ between an area of the first gate portion thereof and a sum of areas of the first and second gate portions, a respectively different fraction of the gate dielectric has been subjected to the stress voltage. In each device, the portion of the gate structure subjected to the stress voltage will exhibit a combination of BTI and TDDB degradation, and the portion of the gate structure that is not subjected t the stress voltage will exhibit only TDDB degradation.

At step 404, for each device, the first and second gate portions are biased with a common voltage for measurement of properties after application of the stress voltage. For example, in one embodiment, the first gate portion 108a and second gate portion 108b, source 104 and OD 106 are coupled to ground (zero volts), the drain 102 is connected to Vdd or a low voltage (e.g., 0.1 V), and the first gate portion 108a and second gate portion 108b are coupled to the power rail Vdd. For example, a stress voltage may be two times Vdd at 125° C., and may be applied for 1000 seconds. In some embodiments, the stress voltage, stress temperature and time are the same for all of the test devices.

At step 406, data are collected indicating a respective degradation for each device 100a, 100b due to the stress voltage. The degradation has a component due to TDDB and a component due to BTI. The measured parameter for TDDB is gate leakage current Ig and the parameter of BTI is saturation current Idsat, but when there is gate leakage, Idsat will be affected too, so that degradation will reflect both TDDB and BTI.

At step 408, the data are extrapolated. First, a regression is performed relating the total percentage of degradation to the area ratio $A_{108a}/(A_{108a}+A_{108b})$. In some embodiments, the regression is a first order linear regression based on at least two data points, yielding a regression line. In other embodiments, a higher order regression, such as a second order (quadratic) regression is performed to determine a higher order curve relating degradation to the area ratio. In some embodiments, the regression is performed by a programmed computer implementing a least squares best fit regression algorithm to determine the regression line or curve corresponding to the test data.

Having computed or graphically determined a line or curve relating the degradation function to the area ratio, the results are extrapolated to find end points corresponding to an area ratio of 1.0 and an area ratio of 0.0. The area ratio of 1.0 corresponds to a scenario in which the entire gate dielectric is subjected to the stress voltage, and any measured degradation would be due to pure TDDB. In some embodiments, the extrapolation is performed by the computer based on the output of the best fit regression curve.

At step 410, the area ratio of zero corresponds to a scenario in which none of the gate dielectric is subjected to the stress voltage, and any measured degradation would be due to pure BTI.

Because BTI degradation is recovered over time, and a plurality of degradation measurements (saturation current, Idsat, linear drain current, Idlin, and threshold voltage Vt) are collected over time, depending on when the measurements are taken, the measurements may reflect partial BTI recovery. The data collected may be adjusted to account for this partial recovery, using a method as described in U.S. Patent Application Publication No. 2010/0097091, published Apr. 22, 2010, (U.S. patent application Ser. No. 12/252,904, filed Oct. 16, 2008), which is incorporated by reference herein in its entirety. Alternatively, another recovery-free methodology can be applied. Thus, after applying the correction, a measure reflecting the pure BTI degradation is achieved, with compensation for the time of measurement.

Figure 5:
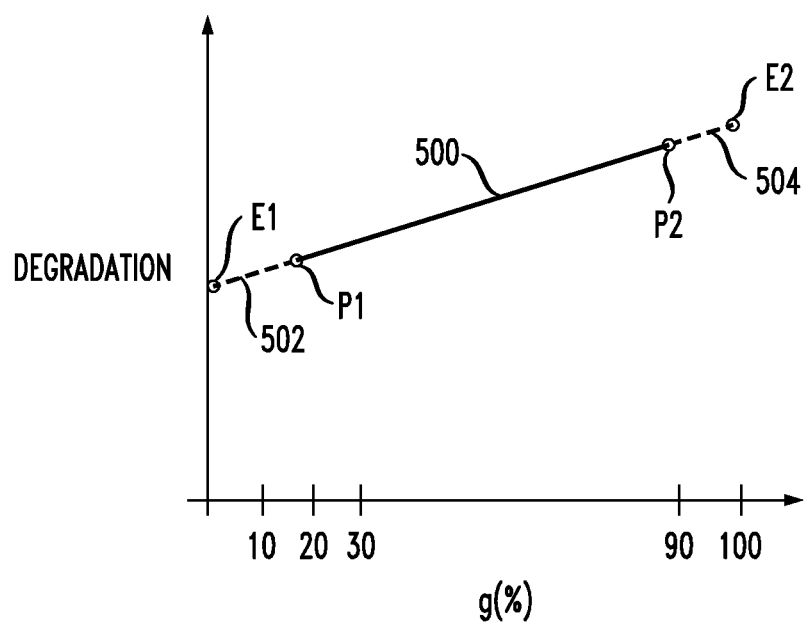
FIG. 5 is a flow chart of a method of determining the TDDB component from the test data collected from the test structures of FIGS. 1A-1C.

FIG. 5 is a schematic diagram showing the extrapolation from the collected data to determine the degradation component due to TDDB and the degradation component due to BTI. A plurality of data points P1, P2 are collected, each including a measurement of degradation and a corresponding area ratio $A_{108a}/(A_{108a}+A_{108b})$. Each of the collected data points corresponds to a respectively different configuration having a non-zero first gate portion area $A_{108a}$ and a non-zero second gate portion area $A_{108b}$. For example, one of the points P1 may correspond to device 100a (FIG. 1A) and another one of the points P2 may correspond to device 100b (FIG. 1B).

The solid line segment 500 in FIG. 5 represents interpolated data representing various combinations of BTI and TDDB in varying proportions. The dashed line segment 502 represents extrapolated data corresponding to zero TDDB (i.e., pure BTI). The dashed line segment 504 represents extrapolated data corresponding to zero BTI (i.e., pure TDDB).

In some embodiments of methods, the structure described above may be used for measuring TDDB and BTI degradation. In other embodiments, the split gate device may be used in applications where a large current (voltage) is sometimes applied, but gate oxide integrity is to be preserved for upcoming operations.

Figure 6A:
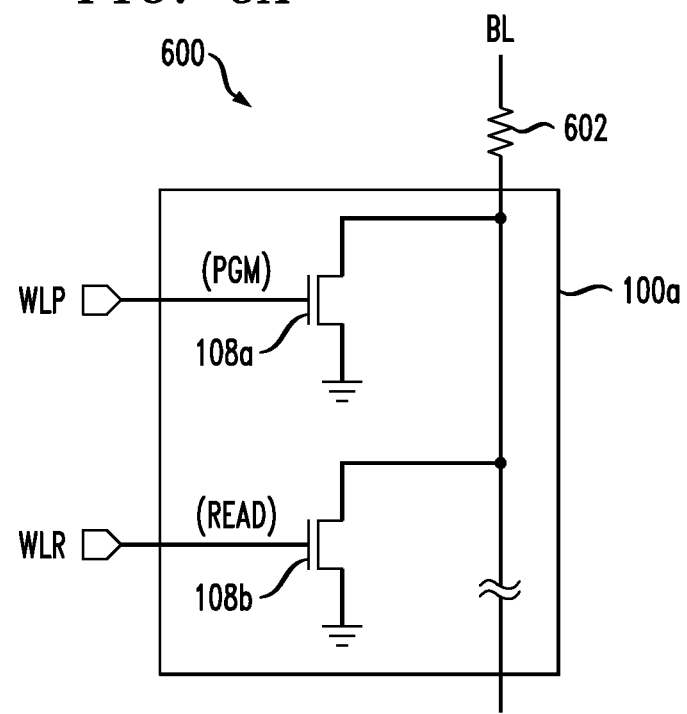
FIG. 6A is a schematic diagram of a one time programmable memory cell including the device of FIG. 1A.

FIG. 6A is a schematic diagram of an embodiment of a one-time programmable (OTP) memory bit cell 600 including the device 100a of FIG. 1A. Any other one of the devices 100b (FIG. 1B) or 100c (FIG. 1C) or any variation of the split gate devices described herein or equivalents thereof may be substituted.

By using the split gate structure, it is possible to apply a very high voltage on one split gate portion 108a and the drain node 102 to provide very high current during programming (which may result in degradation of the gate dielectric of that gate portion 108a), and to reserve the other split gate portion 108b (which has not been stressed during programming) for subsequent reading with a lower voltage (Vdd).

The bit cell 600 has a fuse element 602, which may be a transistor or a passive resistor, for example. The bit cell 600 is programmed just once after manufacturing by "blowing" the fuse 602. The OTP memory cell 600 has a bit line BL and two word lines: a programming word line (WLP) and a reading word line (WLR). Programming word line WLP is connected to one of the split gate portions 108a or 108b, and the reading word line WLR is connected to the other one of the split gate portions. The programming word line WLP is separate from the fuse element 602. During programming, a high voltage in programming word line WLP is asserted on gate portion 108a, and a larger current flows through fuse element 602, programming the fuse. Burning the fuse 602 opens a connection.

After programming, the programming word line WLP is no longer used, and all reads are performed using the reading word line, WLR. For an unprogrammed cell, if the voltage in reading word line WLR is asserted on gate portion 108b, a current corresponding to the unprogrammed resistance value of the fuse 602 (a value of "1") flows from the drain 102 to the source 104. If the bit cell has been programmed, the bit line has an open, causing the bit cell 600 to read as "0".

Figure 6B:
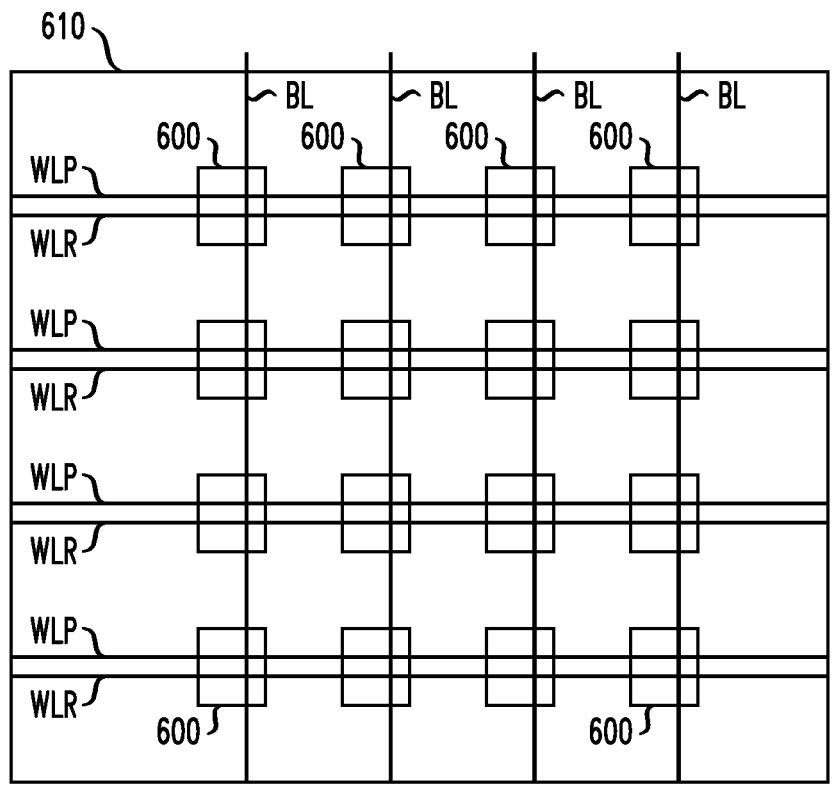
FIG. 6B is a schematic diagram of a one time programmable memory including the memory bit cell of FIG. 6A.

FIG. 6B is a schematic diagram of a one time programmable memory 610 including an array of bit cells 600 of the type shown in FIG. 6A. FIG. 6B shows 4×4 array having four rows and four columns of bit cells 600. Each row has two word lines WLP, WLR, and each column has one bit line BL. One of ordinary skill in the art can readily assemble an OTP memory array 610 having any desired number of rows and columns, where each column of memory bit cells has a respective bit line BL, and each row of memory bit cells has two word lines: a programming word line WLP and a reading word line WLR.

The diagram in FIG. 6B shows a memory 610 having horizontal rows (along word lines) and vertical columns (along bit lines). One of ordinary skill understands that the device may alternatively be oriented so that word lines (rows) may be arranged vertically and bit lines (columns) may be arranged horizontally.

Figure 7:
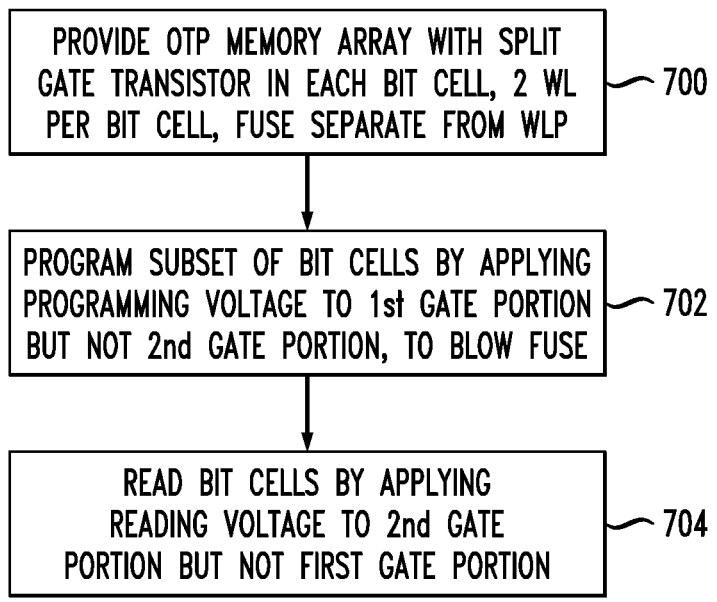
FIG. 7 is a flow chart of a method of using the memory of FIG. 6B.

FIG. 7 is a flow chart of a method of programming the memory 610.

At step 700, an OTP memory array 610 is provided. Each bit cell 600 of the array 610 has a transistor 100a with a split gate 108a, 108b, two word lines WLP and WLR per bit cell, and each bit cell 600 having a fuse 602 separate from the programming word line WLP.

At step 702, a subset of the bit cells are programmed, by applying a programming voltage to the first gate portion 108a (but not the second gate portion 108b) of each transistor 100a to be programmed, to blow the fuse 602 thereof.

At step 704, after completion of programming the subset of bit cells, the programming word lines WLP and the first gate portions 108a are not used. Any bit cell of the array 610 that is to be read is read by asserting the reading word line WLR to apply a voltage to the second split gate portion 108b.

In some embodiments, a method comprises providing first and second semiconductor devices. Each device comprises a transistor having a split gate electrode having first and second gate portions. Each device has a respective ratio between an area of the first gate portion thereof and a sum of areas of the first and second gate portions thereof. For each device, a stress voltage is applied to the first gate portion, but not to the second gate portion. For each device, the first and second gate portions are biased with a common voltage, and data are collected indicating a respective degradation for each device due to the stress voltage. The degradation has a component due to time dependent dielectric breakdown (TDDB) and a component due to bias temperature instability. From the collected data extrapolation determines the degradation component due to TDDB.

In some embodiments, a method comprises providing a one-time programmable array 610 of memory bit cells 600. Each memory bit cell 600 comprises a transistor 100*a* having a split gate electrode including first and second gate portions 108*a*, 108*b*, and a fuse element 602 connected to one of a source 104 or drain 102 of the transistor 100*a*. The array 610 of memory bit cells 600 is programmed by applying a programming voltage to the first gate portion 108*a* of the transistor 100*a* of a subset of the memory bit cells, but not to the second gate portions 108*b* thereof. The programming voltage is sufficient to program the fuse elements 602 of the subset of the memory bit cells 100*a*. After completion of programming the array 610, during reading of the array of memory bit cells 600, a reading voltage is applied only to the second gate portion 108*b* of the transistor of each memory bit cell to be read, and the reading voltage is not applied to the first gate portion 108*a* of the transistor of each memory bit cell to be read.

In some embodiments, a test structure comprises at least one wafer 200 comprising first and second semiconductor devices 100*a*, 100*b*. Each of the first and second semiconductor devices comprises: a transistor 100*a* (100*b*) having a split gate electrode having first 108*a* (108*c*) and second 108*b* (108*d*) gate portions, and having a respective ratio between an area $A_{108a}$ ($A_{108c}$) of the first gate portion thereof and a sum $A_{108a}+A_{108b}$ [$A_{108c}+A_{108d}$] of areas of the first and second gate portions thereof. The ratio $A_{108c}/(A_{108c}+A_{108d})$ of the second device 100*b* is different from the ratio $A_{108a}/(A_{108a}+A_{108b})$ of the first device 100*a*.

Although the subject matter has been described in terms of exemplary embodiments, it is not limited thereto. Rather, the appended claims should be construed broadly, to include other variants and embodiments, which may be made by those skilled in the art.

What is claimed is:

1. A method comprising:
   providing first and second semiconductor devices, each comprising a transistor having a split gate electrode having first and second gate portions, and having a respective ratio between an area of the first gate portion thereof and a sum of areas of the first and second gate portions thereof;
   for each device, applying a stress voltage to the first gate portion, but not to the second gate portion; and
   for each device, biasing the first and second gate portions with a common voltage, and collecting data indicating a respective degradation for each device due to the stress voltage, the degradation having a component due to time dependent dielectric breakdown (TDDB) and a component due to bias temperature instability;
   using a programmed computer to extrapolate from the collected data to compute a value of the degradation component due to TDDB.

2. The method of claim 1, wherein the providing step includes a high dielectric constant metal gate (HKMG) process.

3. The method of claim 1, wherein each of the semiconductor devices comprises:
   a plurality of source regions connected to each other, and
   a plurality of drain regions connected to each other,
   wherein the first and second gate portions each have at least one segment arranged between a respective one of the plurality of source regions and an adjacent one of the plurality of drain regions.

4. The method of claim 3, wherein:
   the plurality of drain regions are arranged in a first comb configuration;
   the plurality of source regions are arranged in a second comb configuration, with the source regions and drain regions interleaved with each other;
   at least one of the first and second gate portions includes a plurality of fingers arranged in a comb configuration; and
   each source region is separated from each adjacent drain region by a respective one of the first or second gate portions.

5. The method of claim 1, wherein the extrapolating comprises estimating an amount of degradation when the value of the ratio is equal to 1.0.

6. The method of claim 5, further comprising extrapolating from the collected data to determine the degradation component due to BTI by estimating an amount of degradation when the value of the ratio is equal to zero.

7. The method of claim 5, wherein the extrapolation is linear.

8. The method of claim 1, further comprising switching input connections from the first gate portion alone to the both of the first and second gate portions, between the steps of applying the stress voltage and biasing the first and second gate portions.

9. A method comprising:
   (a) providing a one-time programmable array of memory bit cells, each memory bit cell comprising a transistor having a split gate electrode including first and second gate portions, and a fuse element connected to one of a source or drain of the transistor;
   (b) programming the array of memory bit cells by applying a programming voltage to the first gate portion of the transistor of a subset of the memory bit cells, but not to the second gate portions thereof, the programming voltage sufficient to program the fuse elements of the subset of the memory bit cells; and
   (c) after completion of step (b), during reading of the array of memory bit cells, applying a reading voltage only to the second gate portion of the transistor of each memory bit cell to be read, and not applying the reading voltage to the first gate portion of the transistor of each memory bit cell to be read.

10. The method of claim 9, wherein:
    the array of memory bit cells is arranged in rows and columns, the array having a bit line for each column and a programming word line for each row; and
    step (b) includes applying the programming voltage to the programming word lines corresponding to the subset of the memory bit cells.

11. The method of claim 10, wherein the array further comprises a reading word line for each row, and step (c) includes applying the reading voltage to the reading word line corresponding to a memory bit cell to be read.

12. The method of claim 9, wherein the transistor comprises:
    a plurality of source regions connected to each other, and
    a plurality of drain regions connected to each other,
    wherein the first and second gate portions each have at least one segment arranged between a respective one of the plurality of source regions and an adjacent one of the plurality of drain regions.

13. The method of claim 12, wherein:

the plurality of drain regions are arranged in a first comb configuration;

the plurality of source regions are arranged in a second comb configuration, with the source regions and drain regions interleaved with each other;

at least one of the first and second gate portions includes a plurality of fingers arranged in a comb configuration; and each source region is separated from each adjacent drain region by a respective one of the first or second gate portions.

14. The method of claim 9, wherein:

the array of memory bit cells is arranged in rows and columns, the array having a programming word line for each row and a reading word line for each row; and the programming word line is separate from the fuse element.

15. A test structure, comprising:

at least one wafer comprising first and second semiconductor devices, each of the first and second semiconductor devices comprising:

a transistor having a split gate electrode having first and second gate portions, and having a respective ratio between an area of the first gate portion thereof and a sum of areas of the first and second gate portions thereof, wherein the transistor of the first device and the transistor of the second device have source regions that are the same as each other, the transistor of the first device and the transistor of the second device have drain regions that are the same as each other, and the ratio of the second device is different from the ratio of the first device.

16. The test structure of claim 15, wherein each transistor has a high-k gate dielectric layer.

17. The test structure of claim 15, wherein each of the transistors comprises:

a plurality of source regions connected to each other, and a plurality of drain regions connected to each other, wherein the first and second gate portions each have at least one segment arranged between a respective one of the plurality of source regions and an adjacent one of the plurality of drain regions.

18. The test structure of claim 17, wherein:

the plurality of drain regions are arranged in a first comb configuration;

the plurality of source regions are arranged in a second comb configuration, with the source regions and drain regions interleaved with each other;

at least one of the first and second gate portions includes a plurality of fingers arranged in a comb configuration; and each source region is separated from each adjacent drain region by a respective one of the first or second gate portions.

19. The test structure of claim 15, further comprising at least one switching device connected to the first and second gate portions of at least one of the first and second semiconductor devices, for switching input connections from the first gate portion alone to both the first and second gate portions.

* * * * *